(12) United States Patent
Yoshida et al.

(10) Patent No.: US 8,304,015 B2
(45) Date of Patent: Nov. 6, 2012

(54) RESIN FILM FORMING METHOD, RESIN FILM FORMING APPARATUS, AND ELECTRONIC CIRCUIT BOARD MANUFACTURING METHOD

(75) Inventors: Junichi Yoshida, Kanagawa-ken (JP); Seiichi Inoue, Kanagawa-ken (JP); Jun Yamanobe, Kanagawa-ken (JP); Manabu Katsumura, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 1186 days.

(21) Appl. No.: 12/057,079

(22) Filed: Mar. 27, 2008

(65) Prior Publication Data
US 2008/0241360 A1 Oct. 2, 2008

(30) Foreign Application Priority Data
Mar. 30, 2007 (JP) ................... 2007-095512

(51) Int. Cl.
B28B 19/00 (2006.01)
B29B 15/10 (2006.01)
C23C 18/00 (2006.01)
C23C 20/00 (2006.01)
C23C 24/00 (2006.01)
C23C 26/00 (2006.01)
C23C 28/00 (2006.01)
C23C 30/00 (2006.01)
H01C 17/06 (2006.01)
H05K 3/00 (2006.01)

(52) U.S. Cl. .................................... 427/97.3
(58) Field of Classification Search .................. 427/97.3
See application file for complete search history.

(56) References Cited

U.S. PATENT DOCUMENTS
6,810,814 B2 * 11/2004 Hasei ........................ 101/485
7,146,910 B2 12/2006 Hasei
2005/0122351 A1 * 6/2005 Yamazaki et al. ............. 347/5
2007/0148416 A1 * 6/2007 Wolkin et al. ............. 428/195.1

FOREIGN PATENT DOCUMENTS
JP 56-66089 A 6/1981
JP 2003-311197 A 11/2003
JP 2004-927 A 1/2004
JP 2004-351305 A 12/2004

OTHER PUBLICATIONS
Japanese Office Action, issued on Nov. 14, 2011 for Japanese Application No. 2007-095512.

* cited by examiner

*Primary Examiner* — Nathan Empie
*Assistant Examiner* — Austin Murata
(74) *Attorney, Agent, or Firm* — Birch, Stewart, Kolasch & Birch, LLP

(57) ABSTRACT

A method forms a resin film on a substrate by depositing droplets of resin liquid by an inkjet method. The method includes: a first resin liquid arrangement step of arranging a plurality of droplets of a first resin liquid separately from each other on a substrate in such a manner that the droplets do not make contact with each other; a first resin liquid curing step of curing at least a surface of each of the droplets of the first resin liquid arranged on the substrate; a second resin liquid arrangement step of arranging a plurality of droplets of a second resin liquid at substantially central positions between the droplets of the first resin liquid on the substrate, after the at least the surface of each of the droplets of the first resin liquid is cured; and a second resin liquid curing step of curing the droplets of the second resin liquid arranged on the substrate.

3 Claims, 12 Drawing Sheets

RESIN FILM FORMING METHOD, RESIN FILM FORMING APPARATUS, AND ELECTRONIC CIRCUIT BOARD MANUFACTURING METHOD

BACKGROUND OF THE INVENTION

1. Field of the Invention

The present invention relates to a resin film forming method, a resin film forming apparatus and an electronic circuit board manufacturing method, and more particularly, to technology for forming a prescribed resin film pattern on a substrate by ejecting droplets of resin liquid by means of an inkjet method.

2. Description of the Related Art

There are known methods for manufacturing electronic circuit boards or printed circuit boards, such as a subtractive method, a semi-additive method, an additive method, and the like, using photolithography as described below. Below, a brief description of these methods is given.

In the subtractive method, a copper clad laminate plate 902 composed of an insulating base material (insulating layer) 901 and copper foil conductor layers (conductive layers) 903 is prepared as shown in FIG. 17A. A hole 904 which is to form a through hole is formed in the copper clad laminate plate 902 as shown in FIG. 17B, and a conductor layer 907 is formed on the surface of the conductor layers 903 and the inside of the hole 904 by electroless plating or electrolytic plating, thereby creating a through hole 904 as shown in FIG. 17C. Then, resist layers 905 are formed by a dry film resist (DFR) or a liquid resist on the copper clad laminate plate 902 in which the through hole 904 has been formed, and the resist layers 905 are patterned as shown in FIG. 17D, by exposing and developing electronic circuit patterns in the resist layers 905 using a photo tool (not shown). Thereupon, the portions of the conductor layers 903 and 907 that have not been covered with the resist patterns (the resist layers 905) are removed by etching as shown in FIG. 17E, and finally the resist layers 905 are removed, thereby completing a printed circuit board 908 having prescribed circuit patterns as shown in FIG. 17F.

In the additive method, an insulating base material 911 is prepared as shown in FIG. 18A. A hole 914 which is to form a through hole is formed in the insulating base material 911 as shown in FIG. 18B. Then, resist layers 915 are formed by means of a dry film resist (DFR) or liquid resist on the insulating base material 911, and the resist layers 905 are patterned as shown in FIG. 18C, by exposing and developing electronic circuit patterns in the resist layer 905 using a photo tool (not shown). Thereupon, conductor layers 917 which are to be circuit patterns are formed by electroless plating on the portions of the insulating base material 911 that have not been covered with the resist layers 915, the conductor layers 917 are also formed inside the hole 914, thereby creating a through hole 914 as show in FIG. 18D, and finally the resist layers 915 are removed, thereby completing a printed circuit board 918 having prescribed circuit patterns as shown in FIG. 18E.

In the semi-additive method, an insulating base material 921 is prepared as shown in FIG. 19A. A hole 924 which is to form a through hole is formed in the insulating base material 921 as shown in FIG. 19B, and conductor layers 923 are formed on the surface of the insulating base material 921 and inside the clearance hole 924 by electro plating as shown in FIG. 19C. Then, resist layers 925 are formed by a dry film resist (DFR) or liquid resist, and the resist layers 925 are patterned as shown in FIG. 19D, by exposing and developing electronic circuit negative patterns in the resist layers 925, by using a photo tool (not shown). Thereupon, conductor layers 927 which are to be circuit patterns are formed by electrolytic plating as shown in FIG. 19E, taking the portions of the conductor layers 923 that have not been covered with the resist layers 925 as seed layers. Then, the resist layers 925 are removed as shown in FIG. 19F, and the portions of the conductor layers 923 that have not been plated with the conductor layers 927 are removed by etching, thereby completing a printed circuit board 928 having prescribed circuit patterns as shown in FIG. 19G.

In the above-described methods using the photolithography, the steps for creating the photo tool and performing exposure and development are required in order to obtain the desired resist pattern, and this is problematic in that it requires a large amount of time and involves significant cost. Furthermore, there is also a problem of processing the waste liquid from the development step.

Under these circumstances, a method has been proposed which prints a resist pattern directly by means of an inkjet system (see, for example, Japanese Patent Application Publication No. 56-66089). More specifically, droplets of a liquid resist material (resist ink) are ejected from an inkjet type ejection head (inkjet head) to directly print resist patterns onto a substrate, and by then carrying out etching using the resist patterns as a mask, it is possible to obtain a printed circuit board having desired wiring patterns (circuit patterns). By adopting this method, it is possible to eliminate the steps of creation of the photo tool, lamination with dry film resist (DFR), exposure and development.

Furthermore, methods for directly printing wiring patterns by means of an inkjet system have also been proposed (see, for example, Japanese Patent Application Publication Nos. 2004-000927 and 2004-351305). More specifically, a dispersion liquid containing conductive micro-particles dispersed in a dispersion medium is ejected in the form of droplets from an inkjet type of ejection head (an inkjet head), thereby printing desired wiring patterns directly onto a substrate, and it is possible to obtain a printed circuit board having prescribed wiring patterns. These methods are not limited to the manufacture of printed circuit boards, but may also be used appropriately for forming conductive film wiring patterns and films constituting color filters in various types of devices (for instance, a plasma type display device, a liquid crystal display device, an organic electroluminescence (EL) display device, and the like).

However, the above-described methods involve problems as follows.

The method in Japanese Patent Application Publication No. 56-66089 is for directly printing resist patterns by using the inkjet system, and more specifically, for directly printing resist (i.e., an ink including an acid-resistant material that forms a solid body upon drying) onto the surface of a copper foil, by means of the inkjet method. In this method, the steps of creation of the photo tool, lamination with dry film resist, exposure and development are eliminated, and therefore the related consumables, such as processing agents, and processing equipment, are not required. However, since the resist is printed by the inkjet method directly onto the surface of the copper foil as described above, then the droplets that have landed on the copper foil and not yet dried spread over the surface of the copper foil, and consequently, the droplets combine with each other giving rise to problems such as bulging (swelling of the wires), and jaggedness (undulations in the wires). In particular, since the viscosity is adjusted to 3 cP to 20 cP by means of a silicone varnish, then when the droplets having this low level of viscosity land on the surface of the copper foil, bulging is even more liable to occur. In other words, with this method, it is difficult to obtain desired resist patterns.

The method in Japanese Patent Application Publication No. 2004-000927 is for directly printing wiring patterns by using the inkjet system, and more specifically, by forming first patterns by first droplets L1 and then arranging second droplets L2 between the first patterns in order to unite the first patterns together. According to this method, it is possible to form film patterns having broad widths and good pattern edge shapes, and furthermore, since the film patterns have the broad widths, then beneficial effects are obtained in that electrical conductivity is good, and shorting, disconnections, and the like, are not liable to occur. In spite of these, even if there is no combination between the droplets L1 due to mutual contact between the droplets L1 in the first step of the droplet arrangement step, substantial wetting and spreading of the droplets L1 tend to occur, and in order to suppress these, it is necessary to process the surface of the substrate (providing a surface treatment) to make the surface capable of repelling the liquid material. In particular, if a self-assembling film forming method is used in the surface treatment step, then a long processing time is required since the film must be left for 2 to 3 days at room temperature and maintained at 100° C. for 3 hours, and therefore the manufacturing costs are high, and moreover, the film compound such as fluoroalkylsilane (FAS) is expensive. If a plasma irradiation method is used for the surface treatment step, then since the work must be carried out in a vacuum and requires use of a gas, and so on, then there are problems in that the number of processes and apparatuses required increases yet further. Furthermore, in the first step of the droplet arrangement step, removal of the diffusion medium is advanced by previously heating the substrate, which is desirable in order to stabilize the diameters of the droplets L1, and to standardize the film thickness while also achieving a large film thickness, but since the droplets L2 do not wet and spread over the surface when they are arranged, and furthermore, since the removal of the dispersion medium of the droplets L2 progresses simultaneously, then there is a risk that the droplets L2 do not fill in the gaps between the droplets L1 having been deposited.

The method in Japanese Patent Application Publication No. 2004-351305 is for directly printing wiring patterns by using the inkjet system, and more specifically, the method includes a first ejection step of depositing droplets at intervals within a region to be coated between liquid-repelling regions, and a second ejection step of depositing droplets within the region to be coated, at staggered deposition positions in comparison with the previous first deposition. By adopting this method, it is possible to achieve a film of large and uniform thickness, but in order to deposit the droplets onto the region to be coated, which is situated between the liquid-repelling regions formed by a liquid-repelling film, it is necessary to provide the repelling and non-repelling patterns on the substrate beforehand. In particular, if a self-assembling film forming method is used in the liquid-repelling treatment step, then problems similar to those of Japanese Patent Application Publication No. 2004-000927 arise. Furthermore, if an ultraviolet light irradiation method is used in the liquid-repelling treatment step, then a mask corresponding to the wiring patterns is required, and consequently, it is necessary to use the photolithographic method.

SUMMARY OF THE INVENTION

The present invention has been contrived in view of these circumstances, an object thereof being to provide a resin film forming method, a resin film forming apparatus, and an electronic circuit board manufacturing method, whereby the width and film thickness of a resin film pattern can be made uniform, without the occurrence of bulges or jagged portions in the resin film.

In order to attain the aforementioned object, the present invention is directed to a method of forming a resin film on a substrate by depositing droplets of resin liquid by an inkjet method, comprising: a first resin liquid arrangement step of arranging a plurality of droplets of a first resin liquid separately from each other on a substrate in such a manner that the droplets do not make contact with each other; a first resin liquid curing step of curing at least a surface of each of the droplets of the first resin liquid arranged on the substrate; a second resin liquid arrangement step of arranging a plurality of droplets of a second resin liquid at substantially central positions between the droplets of the first resin liquid on the substrate, after the at least the surface of each of the droplets of the first resin liquid is cured; and a second resin liquid curing step of curing the droplets of the second resin liquid arranged on the substrate.

According to this aspect of the present invention, by separately arranging the droplets of the first resin liquid on the substrate, there is no combination between the droplets of the first resin liquid, and furthermore, by arranging the droplets of the second resin liquid between the droplets of the first resin liquid in a state where at least the surface of the droplets of the first resin liquid is cured, then the droplets of the second resin liquid wet and spread so as to form bridges (liquid bridges) between the mutually adjacent droplets of the first resin liquid, and hence are able to fill in the gaps between the droplets of the first resin liquid. Consequently, no bulges or jagged portions arise, and it is possible to achieve uniform width and thickness of the resin film pattern.

The first resin liquid and the second resin liquid may be different materials or they may be the same material.

Preferably, the first resin liquid and the second resin liquid have curing properties different from each other.

According to this aspect of the present invention, it is possible to cure the first and second resin liquids reliably, without the first and second resin liquids affecting each other, and therefore it is possible to form a more accurate resin film pattern.

Preferably, the first resin liquid has thermally curable properties; and the first resin liquid arrangement step is carried out in a state where at least a surface of the substrate where a pattern of the resin film is to be formed is heated to a temperature not lower than a curing temperature of the first resin liquid.

According to this aspect of the present invention, since the droplets of the first resin liquid are thermally cured simultaneously with landing on the substrate, then it is possible to predict the diameter of the droplets of the first resin liquid after thermal curing, on the basis of the surface temperature of the substrate and the characteristics of the first resin liquid, and it is possible to optimize the volume of the droplets of the second resin liquid, which are arranged between the mutually adjacent droplets of the first resin liquid. Consequently, it is possible to achieve more uniform width and film thickness in the resin film pattern.

Preferably, the method further comprises: a third resin liquid arrangement step of separately arranging at least two droplets of a third resin liquid of smaller volume than the droplets of the first resin liquid so as not to make contact with the droplets of the first resin liquid at respective edge portions, in a direction perpendicular to a direction of arrangement of the droplets of the first resin liquid, of a region corresponding to a gap between the droplets of the first resin liquid on the substrate; and a third resin liquid curing step of curing at least a surface of each of the droplets of the third resin liquid arranged on the substrate, wherein the second resin liquid arrangement step is carried out after the at least the surface of each of the droplets of the third resin liquid is cured.

According to this aspect of the present invention, the at least two droplets of the third resin liquid, which are separately arranged at prescribed positions between the droplets of the first resin liquid on the substrate (at positions where the gap between the droplets of the first resin liquid is large) and of which at least the surface is cured, function as columns that prevent the subsequently arranged droplets of the second resin liquid from wetting and spreading further than necessary in the direction perpendicular to the direction of arrangement of the droplets of the first resin liquid, and therefore it is possible to achieve a more uniform width of the resin film pattern.

Preferably, the first resin liquid and the third resin liquid have identical curing properties.

According to this aspect of the present invention, it is also possible to cure the first resin liquid and the third resin liquid by means of the same curing device, and hence it is possible to improve productivity and reduce costs.

Preferably, in the third resin liquid arrangement step, the droplets of the third resin liquid are layered together at an identical position on the substrate.

According to this aspect of the present invention, the effect in preventing the droplets of the second resin liquid from wetting and spreading further than necessary in the direction perpendicular to the direction of arrangement of the droplets of the first resin liquid is enhanced further, and the volume of the second resin liquid can be increased, as well as increasing the thickness of the resin film pattern.

In order to attain the aforementioned object, the present invention is also directed to a resin film forming apparatus, comprising: a first resin liquid ejection device which ejects droplets of a first resin liquid toward a substrate; a second resin liquid ejection device which ejects droplets of a second resin liquid toward the substrate; a first resin liquid curing device which cures the droplets of the first resin liquid deposited on the substrate; a second resin liquid curing device which cures the droplets of the second resin liquid deposited on the substrate; and an ejection control device which controls the first resin liquid ejection device in such a manner that the droplets of the first resin liquid are separately arranged on the substrate so as not to make contact with each other, and controls the second resin liquid ejection device in such a manner that the droplets of the second resin liquid are arranged at substantially central positions between the droplets of the first resin liquid on the substrate.

According to this aspect of the present invention, the first resin liquid ejection device and the second resin liquid ejection device may be constituted of one liquid ejection head, or they may be constituted of different liquid ejection heads.

Preferably, the first resin liquid and the second resin liquid have curing properties different from each other.

Preferably, the first resin liquid has thermally curable properties; the resin film forming apparatus further comprises a heating control device which heats at least a surface of the substrate where a pattern of the resin film is to be formed to a temperature not lower than a curing temperature of the first resin liquid; and the ejection control device controls the first resin liquid ejection device in such a manner that the droplets of the first resin liquid are separately arranged on the substrate, in a state where the at least the surface of the substrate where the pattern of the resin film is to be formed is heated to the temperature not lower than the curing temperature of the first resin liquid by means of the heating control device.

Preferably, the resin film forming apparatus further comprises: a third resin liquid ejection device which ejects droplets of a third resin liquid of smaller volume than the droplets of the first resin liquid toward the substrate, wherein the ejection control device controls the third resin liquid ejection device in such a manner that at least two droplets of the third resin liquid are arranged so as not to make contact with the droplets of the first resin liquid at respective edge portions, in a direction perpendicular to a direction of arrangement of the droplets of the first resin liquid, of a region corresponding to a gap between the droplets of the first resin liquid on the substrate.

Preferably, the first resin liquid and the third resin liquid have identical curing properties.

Preferably, the first resin liquid ejection device and the third resin liquid ejection device are constituted of an identical liquid ejection head having first nozzles which eject the droplets of the first resin liquid and second nozzles which eject the droplets of the third resin liquid.

Preferably, at least one of the second nozzles is arranged on each side of each of the first nozzles.

In order to attain the aforementioned object, the present invention is also directed to an electronic circuit board manufacturing method, comprising the steps of: forming a prescribed resin film pattern by using the above-described resin film forming method, on the substrate having a conductor layer formed on a surface thereof, the resin film pattern being formed on a surface of the conductor layer; then patterning the conductor layer by removing portions of the conductor layer that are not covered with the resin film pattern; and then removing the resin film pattern from the substrate.

According to the present invention, by separately arranging the droplets of the first resin liquid on the substrate, there is no combination between the droplets of the first resin liquid, and furthermore, by arranging the droplets of the second resin liquid between the droplets of the first resin liquid in a state where at least the surface of the droplets of first resin liquid is cured, then the droplets of the second resin liquid wet and spread so as to form bridges (liquid bridges) between the mutually adjacent droplets of the first resin liquid, and hence are able to fill in the gaps between the droplets of the first resin liquid. Consequently, no bulges or jagged portions arise, and it is possible to achieve uniform width and thickness of the resin film pattern.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

First Embodiment

A resin film forming method according to a first embodiment of the present invention is described.

The resin film forming method according to the present embodiment is a method which forms a resin film pattern on a substrate by ejecting droplets of resin liquid from an inkjet type of liquid ejection head (inkjet head).

As an ejection method for a liquid ejection head, it is possible to use a piezoelectric method, which ejects a droplet from a nozzle by pressurizing the liquid (resin liquid) filled in a pressure chamber, by using the displacement of an piezoelectric element, or a thermal method, which ejects a droplet from a nozzle by means of the pressure created by the growth of a bubble generated inside a pressure chamber using thermal energy created by a heat generating element. Of course, the ejection method is not limited to these ejection methods, and the present invention may also be applied to various other ejection methods.

There are no particular restrictions on the substrate used to form a resin film pattern, provided that the material is capable of withstanding the heating and ultraviolet light irradiation steps described below, and it is possible to use various types of substrate, for instance, a glass substrate made of a quartz glass, a silicate glass, soda lime glass, or the like, or a silicon (Si) substrate, a copper clad laminate plate having a copper foil layer (conductor layer) formed on the surface thereof, a metal substrate, or the like.

Figure 1A:
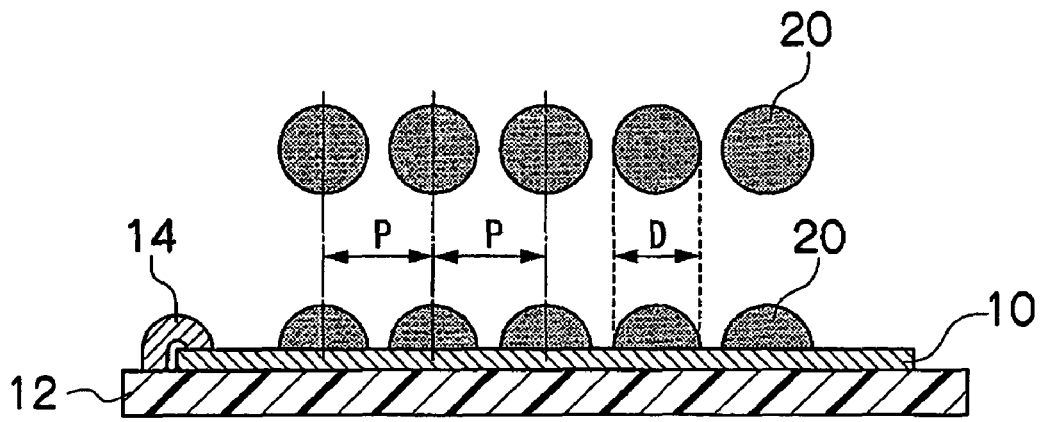
FIGS. 1A and 1B are illustrative diagrams showing a resin film forming method according to a first embodiment of the present invention.
Figure 1B:
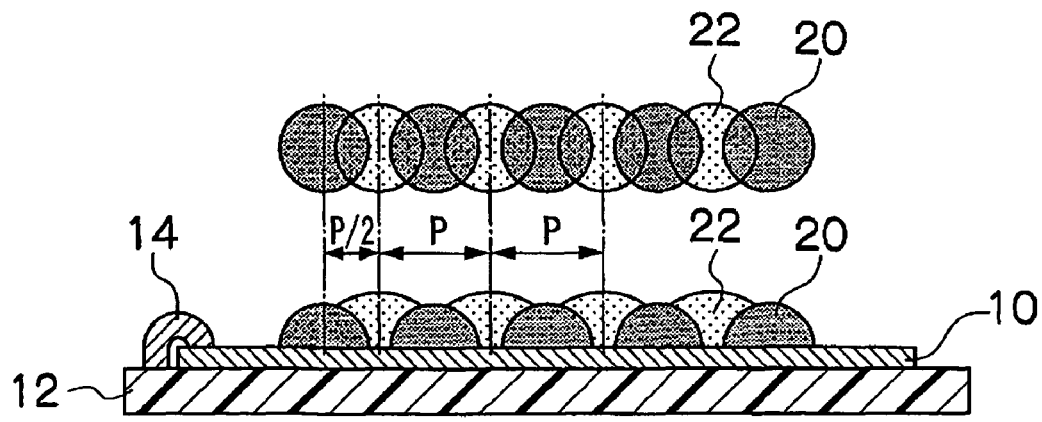

FIGS. 1A and 1B show a procedure for forming a line-shaped resin film pattern on a substrate, in the resin film forming method according to the first embodiment. In FIGS. 1A and 1B, the upper part of each diagram is a plan diagram as viewed from above the substrate 10 for forming a resin film pattern and the lower part is a cross-sectional diagram as viewed from the side of the substrate 10 placed on a fixed table 12. The fixed table 12 also serves as a heating device, and is provided with a heat conductor 14, which transmits the heat generated by the fixed table (heating device) 12 to the surface of the substrate 10 (the surface on which the resin film pattern is to be formed). There are no particular restrictions on the constituent material of the heat conductor 14, and it is especially appropriate to use metal materials having high thermal conductivity, such as gold, silver, copper, or the like.

In the resin film forming method according to the present embodiment, a first resin liquid having thermally curable properties (first curing properties) and a second resin liquid having ultraviolet curable properties (second curing properties) are used. The first and second resin liquids are ejected in the form of droplets, respectively, from liquid ejection heads (not shown), which are provided respectively for the two resin liquids. Of course, there is also a mode in which the first and second resin liquids are respectively ejected in the form of droplets from one liquid ejection head.

Firstly, the first resin liquid is ejected in the form of droplets from the liquid ejection head (not shown), in a state where the surface of the substrate 10 has been heated to a prescribed temperature (not lower than the curing temperature of the first resin liquid) by means of the fixed table (heating device) 12, and as shown in FIG. 1A, a plurality of droplets 20 of the first resin liquid are thereby arranged on the substrate 10 separately from each other in such a manner that the droplets 20 of the first resin liquid that are mutually adjacent when deposited on the substrate 10 do not make contact with each other, in other words, by leaving gaps between the mutually adjacent droplets 20 (the first resin liquid arrangement step).

In order to separately arrange the droplets 20 as described above, taking the distance (separation pitch) to be P between the centers of the droplets 20 that are mutually adjacent on the substrate 10, then it is necessary to make the separation pitch P of the droplets 20 greater than the diameter D of the droplets 20. The separation pitch P and the diameter D of the droplets 20 are the dimensions in a state after the droplets 20 have been cured thermally on the substrate 10. On the other hand, if the interval between the mutually adjacent droplets 20 is too great (in other words, if the separation pitch P of the droplets 20 is too large), then it becomes difficult to control the volume of droplets 22 of the second resin liquid (see FIG. 1B), which are subsequently arranged between the mutually adjacent droplets 20 in the second resin liquid arrangement step described below, and therefore the thickness and width of the resin film pattern are liable to become non-uniform. Hence, it is desirable that the separation pitch P between the droplets 20 is smaller than 1.5 times the diameter D of the droplets 20. In other words, a desirable range for the pitch P of the droplets 20 is represented as D<P<1.5D, and it is thus possible to optimize the droplet volume of the second resin liquid arranged between the mutually adjacent droplets 20, and consequently, the width and thickness of the resin film pattern can be made uniform.

In the present embodiment, before the first resin liquid arrangement step, the surface of the substrate 10 is previously heated to the temperature equal to or higher than the curing temperature of the first resin liquid, which is thermally curable, and therefore the droplets 20 of the first resin liquid that have been ejected from the liquid ejection head and deposited on the substrate 10 are heated and cured (thermally cured) simultaneously with landing on the substrate 10 (the first resin liquid curing step).

Thereupon, droplets of the second resin liquid are ejected from the liquid ejection head (not shown), and each of the droplets 22 of the second resin liquid is arranged at a substantially central position between the mutually adjacent droplets 20 on the substrate 10 as shown in FIG. 1B (the second resin liquid arrangement step).

Since the second resin liquid is ultraviolet-curable, and therefore has different curing properties to those of the first resin liquid, then the droplets 22 of the second resin liquid are not cured at the time when these are landed on the substrate 10, and wet and spread out in the form of a bridge (liquid bridge) between the mutually adjacent droplets 20 that have been in the cured state on the substrate 10, and thereby fill in the gaps between the mutually adjacent droplets 20.

In the embodiment shown in FIGS. 1A and 1B, the droplets 22 are arranged in the central positions between the droplets 20 that are mutually adjacent on the substrate 10. In other words, the droplets 22 are arranged at the same pitch as the separation pitch P of the droplets 20, respectively between the mutually adjacent droplets 20, in positions shifted from the droplets 20 by one half of the separation pitch P of the droplets 20 (in other words, shifted by P/2) in the arrangement direction of the droplets 20 (the lateral direction in FIGS. 1A and 1B).

In implementing the present invention, the amount of shift from the mutually adjacent droplets 20 to the droplets 22 does not necessarily have to be one half of the separation pitch P of the droplets 20 (namely, P/2) (in other words, it is not essential that the droplets 22 are arranged at the central positions between the mutually adjacent droplets 20), provided that the droplets 22 wet and spread so as to cover up the gaps between the droplets 20 without inclining toward either one of the droplets 20 positioned on either side thereof. The amount of shift of the droplets 22 is desirably set to a range of (P/2) ±20%, in other words, to a range of not less than 0.8×(P/2) and not more than 1.2×(P/2). For example, if the resolution is 1200 dpi, the amount of shift of the droplets 22 is desirably in the range of (21.2±2) μm.

After arranging the droplets 22 of the second resin liquid in the substantially central positions between the droplets 20 that are mutually adjacent on the substrate 10, the droplets 22 wet and spread so as to fill in the gaps between the mutually adjacent droplets 20, whereupon ultraviolet light is irradiated onto the surface of the substrate 10 (the second resin liquid curing step).

The ultraviolet light may be irradiated onto the whole of the surface of the substrate 10, or it may be irradiated partially onto the droplets 22 of the second resin liquid. Since the curing properties of the first and second resin liquids are mutually different, then in all cases, it is possible to cure, selectively, the droplets 22 of the second resin liquid only.

Figure 2:
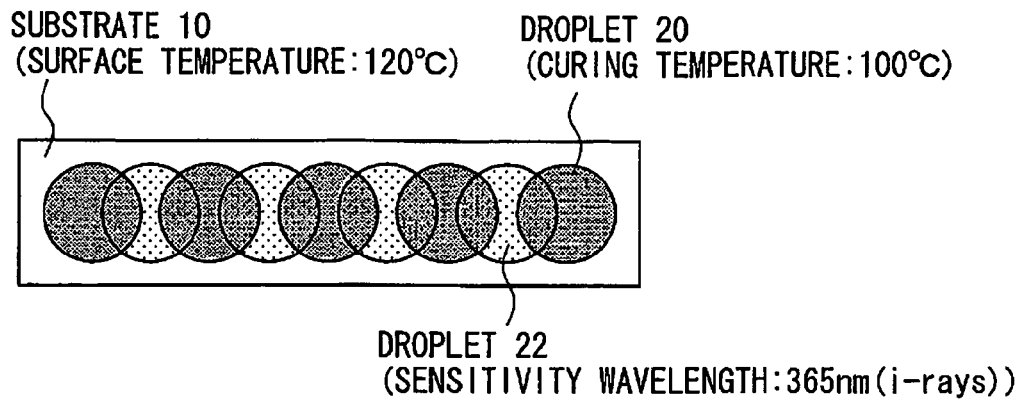
FIG. 2 is an illustrative diagram showing the conditions of resin liquids, and the like, used in the first embodiment.

To give examples of the resin liquids used in the present embodiment, as shown in FIG. 2, a polyimide precursor, or the like, which is thermally cured at a curing temperature of 100° C., is used as the first resin liquid, and a generic resist, photo-curable monomer, or the like, which has a photosensitivity and is cured by irradiation of the ultraviolet light of wavelength of 365 nm (i-rays), is used as the second resin liquid. When carrying out the first resin liquid arrangement step, it is possible to thermally cure the droplets 20 of the first resin liquid simultaneously with their landing on the substrate 10, by previously heating the surface temperature of the substrate 10 to the temperature not lower than 100° C. (for example, at 120° C.). Furthermore, in the second resin liquid curing step, it is possible to cure the droplets 22 of the second resin liquid by irradiating with the ultraviolet light having the photosensitivity wavelength of 365 nm (i-rays).

Thus, using the first and second resin liquids that have different curing properties, the droplets 20 of the first resin liquid are separately arranged on the substrate 10 (the first resin liquid arrangement step), the droplets 20 are thermally cured on the substrate 10 (the first resin liquid curing step), the droplets 22 of the second resin liquid are arranged between the mutually adjacent droplets 20 (the second resin liquid arrangement step), and when the droplets 22 have wet and spread so as to fill in the gaps between the mutually adjacent droplets 20, then the droplets 22 of the second resin liquid are cured by irradiation of ultraviolet light (the second resin liquid curing step). In this way, it is possible to obtain the board on which the desired resin film pattern has been formed on the substrate 10.

According to the present embodiment, by separately arranging the droplets 20 of the first resin liquid on the substrate 10, the droplets 20 are cured without combining with each other, and furthermore, by arranging the droplets 22 of the second resin liquid in between the mutually adjacent droplets 20, the droplets 22 wet and spread so as to bridge (liquid bridge) between the mutually adjacent droplets 20, and therefore it is possible to fill in the gaps between the mutually adjacent droplets 20. Consequently, no bulges or jagged portions arise, and it is possible to achieve uniform width and thickness of the resin film pattern.

In particular, by adopting the mode where, as in the present embodiment, the first resin liquid arrangement step is carried out in the state where the surface of the substrate 10 has been heated previously to the temperature equal to or greater than the curing temperature of the first resin liquid having thermal curing properties, then it is possible to thermally cure the droplets 20 of the first resin liquid that are ejected from the liquid ejection head and deposited on the substrate 10, simultaneously with their landing on the substrate 10, and therefore, as well as improving the productivity of the board, it is possible readily to predict the diameter of the droplets 20 after the thermal curing on the basis of the surface temperature (heating temperature) of the substrate 10 and the properties of the first resin liquid, and it is also possible to optimize the droplet volume of the second resin liquid that is arranged between the mutually adjacent droplets 20.

Since the curing properties of the respective resin liquids are different, then it is possible to achieve reliable curing of the first and second resin liquids, without either liquid affecting the other. In other words, in the state where the conditions for curing the droplets 20 of the first resin liquid have been applied to the substrate 10 (in other words, in the state where the surface of the substrate 10 has been heated to the prescribed temperature), then even if the droplets 22 of the second resin liquid are arranged between the mutually adjacent droplets 20, the droplets 22 wet and spread so as fill in the gaps between the mutually adjacent droplets 20 without the droplets 22 being cured. Consequently, it is possible to form a resin film pattern of higher precision.

In the present embodiment, it is not especially necessary for the droplets 20 to be cured completely to the interiors thereof at the time that the droplets 22 of the second resin liquid are arranged between the droplets 20 of the first resin liquid that are mutually adjacent on the substrate 10, provided that at least the surfaces of the droplets 20 are cured to an extent that prevents landing interference with the droplets 22. In a case such as this, post-heating of the substrate 10 is carried out after the second resin liquid curing step (or it may be carried out before the second resin liquid curing step), in such a manner that the droplets 20 of the first resin liquid are cured completely to the interiors thereof.

In the present embodiment, the mode which heats only the surface of the substrate 10 (the surface where the resin film pattern is to be formed) has been described as one example, and it is also possible to adopt a mode which heats the whole of the substrate 10. However, the mode which heats only the surface of the substrate 10 is desirable, since it is possible to control the surface temperature of the substrate 10 accurately to the temperature suited to the curing temperature of the first resin liquid, regardless of the thickness and material of the substrate 10, and therefore it is possible to form the resin film patterns on various different types of substrate.

The present embodiment has been described with respect to the method for forming the resin film pattern on the substrate 10 by using the first resin liquid that has thermally curable properties (the first curing properties) and the second resin liquid that has ultraviolet curable properties (the second curing properties), but in implementing the present invention, the curing properties of the respective resin liquids are not limited in particular to these. Below, first to fifth modifications of the present embodiment are described.

Figure 3:
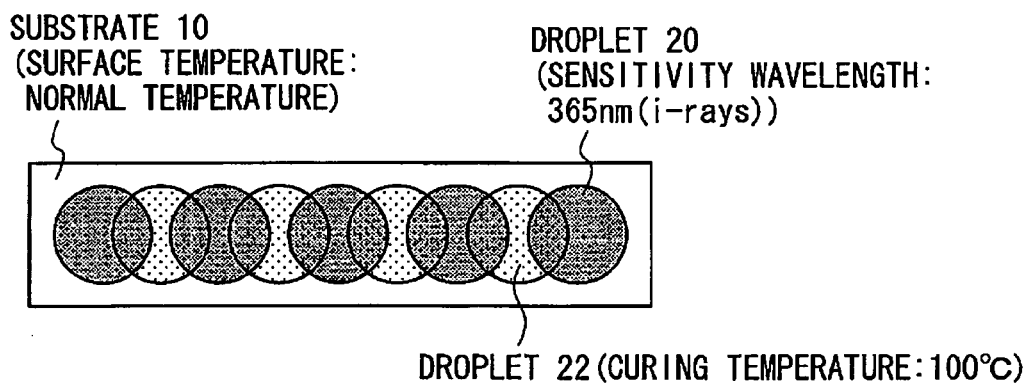
FIG. 3 is an illustrative diagram showing a first modification of the first embodiment.

FIG. 3 is an illustrative diagram of a first modification of the present embodiment. The first modification is a mode in which the curing properties of the respective resin liquids are reversed compared to those of the first embodiment, and therefore a first resin liquid that has ultraviolet curable properties and a second resin liquid that has thermally curable properties are used. More specifically, a generic resist, photo-curable monomer, or the like, which has a photosensitivity and is cured by irradiation of the ultraviolet light of wavelength of 365 nm (i-rays), is used as the first resin liquid, and a polyimide precursor, or the like, which is thermally cured at a curing temperature of 100° C., is used as the second resin liquid.

In the first modification, droplets 20 of the first resin liquid are separately arranged on the substrate 10 in the state where the surface of the substrate 10 is not heated and is at room temperature (the first resin liquid arrangement step), the droplets 20 are cured by the irradiation of the ultraviolet light having the photosensitivity wavelength of 365 nm (i-rays) (the first resin liquid curing step), droplets 22 of the second resin liquid are arranged between the mutually adjacent droplets 20 (the second resin liquid arrangement step), and when the droplets 22 have wet and spread so as to fill in the intervals between the mutually adjacent droplets 20, post-heating is carried out in such a manner that the surface temperature of the substrate 10 becomes equal to or higher than 100° C. (for example, 120° C.), thereby curing the droplets 22 (the second resin liquid curing step).

Figure 4:
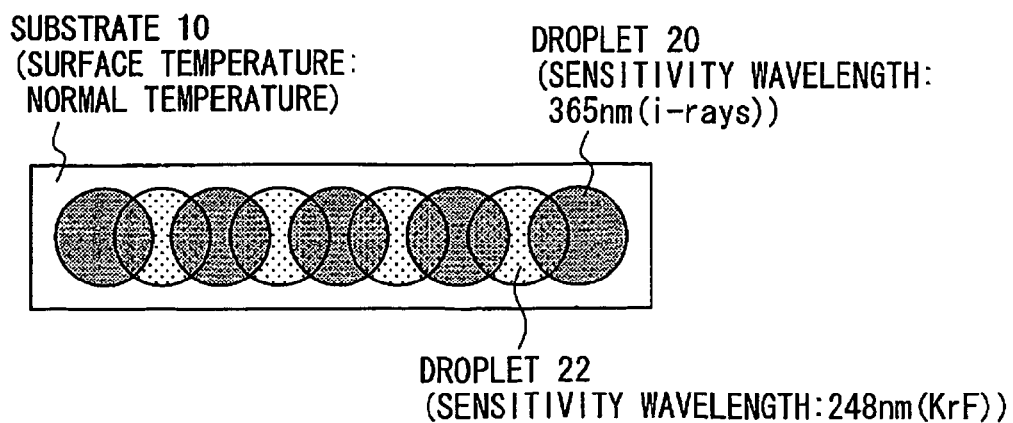
FIG. 4 is an illustrative diagram showing a second modification of the first embodiment.

FIG. 4 is an illustrative diagram of a second modification of the present embodiment. The resin liquids used in the second modification both have ultraviolet curable properties, and they have different photosensitivity wavelengths at which the resin liquids are cured. More specifically, a generic resist, photo-curable monomer, or the like, that is curable by ultraviolet light at a photosensitivity wavelength of 365 nm (i-rays) is used as the first resin liquid, and a generic resist, photo-curable monomer, or the like, that is curable by ultraviolet light at a photosensitivity wavelength of 248 nm (KrF excimer laser) is used as the second resin liquid.

In the second modification, droplets 20 of the first resin liquid are separately arranged on the substrate 10 in the state where the surface of the substrate 10 is not heated and is at room temperature (the first resin liquid arrangement step), the droplets 20 are cured by irradiation of the ultraviolet light having the photosensitivity wavelength of 365 nm (i-rays) (the first resin liquid curing step), droplets 22 of the second resin liquid are arranged between the mutually adjacent droplets 20 (the second resin liquid arrangement step), and when the droplets 22 have wet and spread so as to fill in the intervals between the mutually adjacent droplets 20, the droplets 22 are cured by irradiation of the ultraviolet light having the photosensitivity wavelength of 248 nm (KrF excimer laser) (the second resin liquid curing step).

Figure 5:
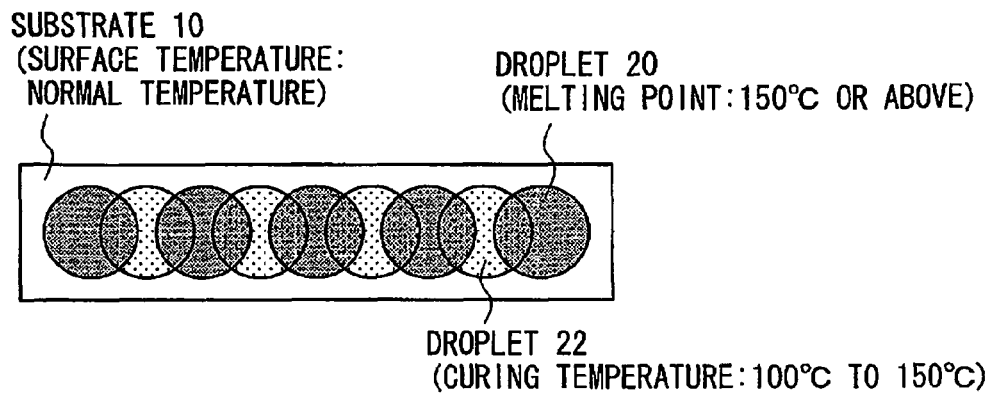
FIG. 5 is an illustrative diagram showing a third modification of the first embodiment.

FIG. 5 is an illustrative diagram of a third modification of the present embodiment. The third modification uses a first resin liquid having thermoplastic properties and a second resin liquid having thermally curable properties. More specifically, a resin liquid having a melting point not lower than 150° C., for instance, polyamide (melting point: 215° C.), polycarbonate (melting point: 230° C.), or the like, is used as the first resin liquid, and a resin liquid having a curing temperature of 100° C. to 150° C., for instance, a polyimide precursor (curing temperature: 100° C.), or the like, is used as the second resin liquid.

In the third modification, the first resin liquid is ejected while being heated to the melting point thereof or above inside the liquid ejection head, in the state where the surface of the substrate 10 is not heated and is at room temperature, thereby separately arranging droplets 20 of the first resin liquid on the substrate 10 (the first resin liquid arrangement step), and hence the droplets 20 are cooled and cured simultaneously with their landing on the substrate 10 (the first resin liquid curing step). Subsequently, the droplets 22 of the second resin liquid are arranged between the mutually adjacent droplets 20 (the second resin liquid arrangement step), and when the droplets 22 have wet and spread so as to fill in the gaps between the mutually adjacent droplets 20, then post-heating is carried out in such a manner that the surface temperature of the substrate 10 becomes equal to or higher than the curing temperature of the second resin liquid, thereby curing the droplets 22 (the second resin liquid curing step).

Figure 6:
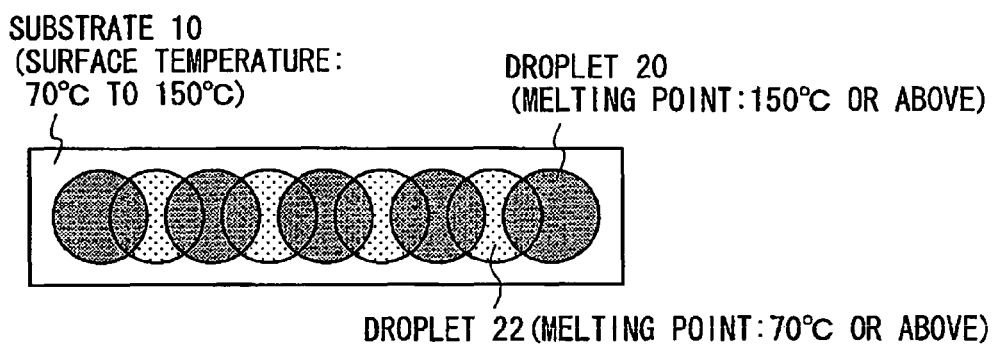
FIG. 6 is an illustrative diagram showing a fourth modification of the first embodiment.

FIG. 6 is an illustrative diagram of a fourth modification of the present embodiment. The resin liquids used in the fourth modification both have thermoplastic properties, and the melting points of these resin liquids are different from each other. More specifically, a resin liquid having a melting point not lower than 150° C., for instance, polyamide (melting point: 215° C.), polycarbonate (melting point: 230° C.), or the like, is used as the first resin liquid, and a resin liquid having a melting point of lower than 150° C. and not lower than 70° C., for instance, polystyrene (glass transition point: 80° C. to 90° C.), acrylonitrile (melting point: 84° C.) or the like, is used as the second resin liquid.

In the fourth modification, the first resin liquid is ejected while being heated to the melting point thereof or above inside the liquid ejection head, in a state where the surface of the substrate 10 has been heated so as to assume a temperature lower than 150° C. and not lower than 70° C. (in other words, a temperature lower than the melting point of the first resist liquid and equal to or higher than the melting point of the second resist liquid), thereby separately arranging droplets 20 of the first resin liquid on the substrate 10 (the first resin liquid arrangement step), and hence the droplets 20 are cooled and cured simultaneously with their landing on the substrate 10 (the first resin liquid curing step). Subsequently, the second resin liquid is ejected while being heated to the melting point thereof or above inside the liquid ejection head, thereby arranging droplets 22 of the second resin liquid between the mutually adjacent droplets 20 (the second resin liquid arrangement step), and when the droplets 22 have wet and spread so as to fill in the gaps between the mutually adjacent droplets 20, then the substrate 10 is cooled under the melting point of the second resin liquid, thereby curing the droplets 22 (the second resin liquid curing step).

Figure 7:
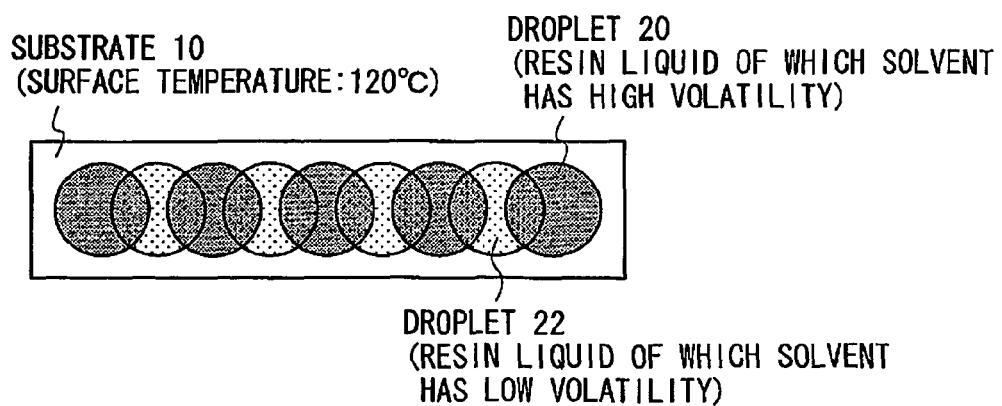
FIG. 7 is an illustrative diagram showing a fifth modification of the first embodiment.

FIG. 7 is an illustrative diagram of a fifth modification of the present embodiment. In the fifth modification, resin liquids having different solvent volatilities are used. More specifically, a volatile resin liquid of which solvent has high volatility (evaporating at 70° C. or above) is used as the first resin liquid, and a non-volatile resin liquid of which solvent has low volatility (evaporating at 150° C. or above) is used as the second resin liquid.

In the fifth modification, the droplets 20 of the first resin liquid are separately arranged on the substrate 10 in a state where the surface of the substrate 10 has been heated to the temperature of 120° C. (the first resin liquid arrangement step), the droplets 20 on the substrate 10 are cured due to evaporation of the solvent (the first resin liquid curing step), droplets 22 of the second resin liquid are arranged between the mutually adjacent droplets 20 (the second resin liquid curing step), and when the droplets 22 have wet and spread so as to fill in the gaps between the mutually adjacent droplets 20, post-heating is carried out in such a manner that the surface of the substrate 10 assumes a temperature of 150° C., thereby curing the droplets 22 due to evaporation of the solvent (the second resin liquid curing step).

In the above-described first to fifth modifications, the droplets 20 of the first resin liquid that are separately arranged on the substrate 10 can be cured immediately without combining together, and furthermore, the droplets 22 of the second resin liquid are able to wet and spread so as to fill in the gaps between the mutually adjacent droplets 20, and consequently, similarly to the first-described embodiment, it is possible to achieve the resin film pattern of uniform width and uniform film thickness, without giving rise to bulges or jagged portions.

Second Embodiment

Next, a resin film forming method according to a second embodiment of the present invention is described. Below, the portions that are common with the first embodiment are not explained further, and the following description centers on the characteristic features of the present embodiment.

Figure 8A:
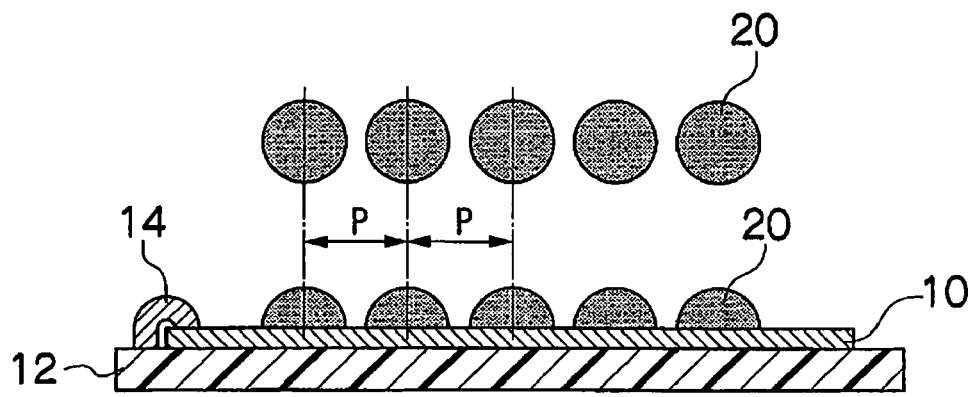
FIGS. 8A to 8C are illustrative diagrams showing a resin film forming method according to a second embodiment of the present invention.
Figure 8B:
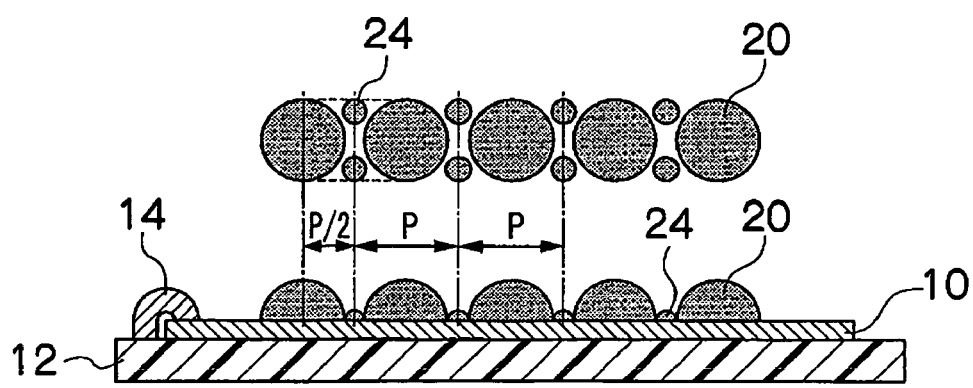
Figure 8C:
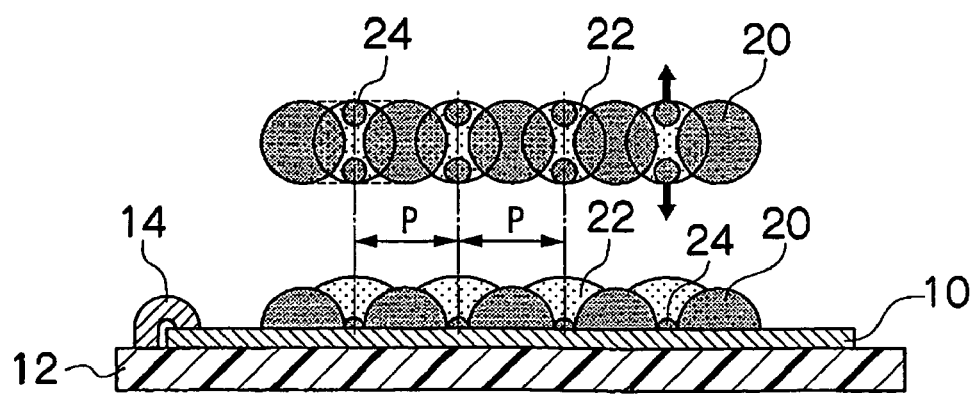

FIGS. 8A to 8C show a procedure for forming a line-shaped resin film pattern, as a resin film forming method according to the second embodiment. In FIGS. 5A to 5C, the upper part of each diagram is a plan diagram as viewed from above the substrate and the lower part is a cross-sectional diagram as viewed from the side of the substrate. In FIGS. 5A to 5C, the parts that are common with those shown in FIGS. 1A and 1B are denoted with the same reference numerals.

In the resin film forming method according to the present embodiment, similarly to the first embodiment, a first resin liquid having thermally curable properties (the first curing properties) and a second resin liquid having ultraviolet curable properties (the second curing properties) are used.

Firstly, in a state where the surface of the substrate 10 has been heated so as to assume a prescribed temperature (the curing temperature of the first resin liquid or above) by the fixed table (heating device) 12, droplets 20 of the first resin liquid are separately arranged on the substrate 10 as shown in FIG. 8A (the first resin liquid arrangement step). Thereby, the droplets 20 are thermally cured on the substrate 10 (the first resin liquid curing step). The steps up to here are similar to those of the first embodiment, and therefore detailed description thereof is omitted.

Thereupon, as shown in FIG. 8B, two droplets of the first resin liquid (small droplets) 24, which have a smaller volume than the volume of the droplets 20, are separately arranged so as not to make contact with the droplets 20, in each of the regions corresponding to the gaps between the droplets 20 of the first resin liquid that are mutually adjacent on the substrate 10 (the small droplet arrangement step). The two small droplets 24 are arranged at the respective edge portions of each of the gap regions in the direction perpendicular to the direction of arrangement of the droplets 20 (the lateral direction in FIG. 8B).

It is possible to adopt a composition in which the droplets 20 and 24 are ejected from a single common liquid ejection head that has large and small nozzles, which eject the droplets of different volumes, or to adopt a composition in which the droplets 20 and 24 are ejected from different liquid ejection heads.

Since the surface of the substrate 10 is previously heated to the curing temperature of the first resin liquid or above, then the droplets (small droplets) 24 of the first resin liquid that have been ejected from the liquid ejection head and deposited on the substrate 10 are heated and cured (thermally cured) simultaneously with landing on the substrate 10 (the small droplet curing step).

Figure 9:
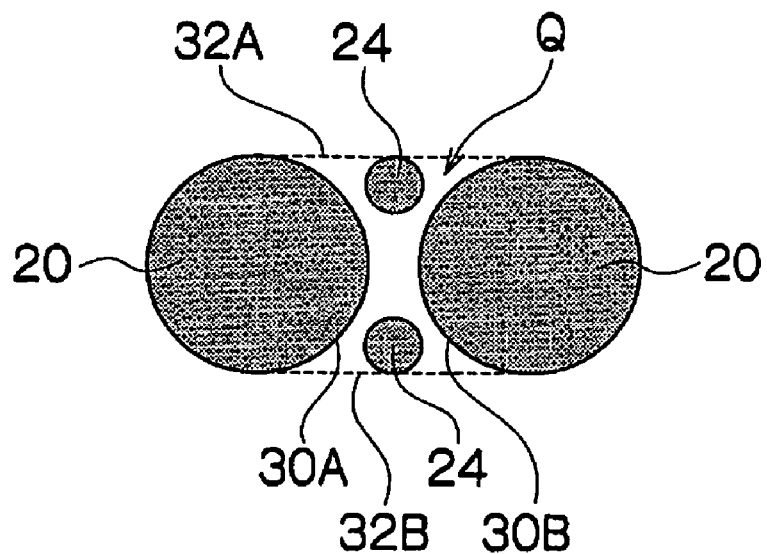
FIG. 9 is an enlarged detailed view showing small droplets.

Here, the small droplet arrangement step is described in detail. FIG. 9 is a detailed diagram showing an enlarged view of a portion of FIG. 5B. The region corresponding to the gap between the mutually adjacent droplets 20 is denoted with Q in FIG. 9. To define the region Q more specifically, the region Q is the region enclosed by the mutually opposing edge line portions 30A and 30B of the edge lines of the mutually adjacent droplets 20, and the common tangents 32A and 32B of the mutually adjacent droplets 20 (namely, the common tangents that are parallel to the direction of arrangement of the droplets 20 (the lateral direction in FIG. 9)).

As shown in FIG. 9, the two small droplets 24 are disposed in the region Q defined as described above, at the edge portions of the region Q in the direction (the longitudinal direction in FIG. 9, and the directions indicated by the arrows in FIG. 8C) perpendicular to the direction of arrangement of the droplets 20. Furthermore, the two small droplets 24 are arranged in substantially central positions between the mutually adjacent droplets 20, in terms 10 of the direction of arrangement of the droplets 20 (the lateral direction in FIG. 9). In particular, in the embodiment illustrated, the two small droplets 24 are contained completely inside the region Q, in such a manner that they respectively make contact with the common tangent lines 32A and 32B.

Since the small droplets 24 are disposed at positions in the region Q where the distance between the mutually adjacent droplets 20 is large, then after thermal curing, the small droplets 24 function as columns that prevent the droplets 22 of the second resin liquid, which are arranged between the mutually adjacent droplets 20 (in other words, in the region Q) in the subsequent step (the second resin liquid arrangement step), from wetting and spreading further than necessary in the direction (the longitudinal direction in FIG. 9 and the direction indicated by the arrows in FIG. 5C) perpendicular to the direction of arrangement of the droplets 20.

If the distance between the centers (separation pitch) of the droplets 20 that are mutually adjacent on the substrate 10 is taken as P (see FIG. 8A), then as shown in FIG. 5B, the pairs of the small droplets 24 are arranged between the mutually adjacent droplets 20, at the same pitch as the separation pitch P of the droplets 20, in positions shifted by one half of the separation pitch P of the droplets 20 (namely, shifted by P/2) with respect to the droplets 20 in the direction of arrangement of the droplets 20 (the lateral direction in FIG. 5B).

In implementing the present invention, the amount of shift from the mutually adjacent droplets 20 to the pair of the small droplets 24 does not necessarily have to be one half of the separation pitch P between the droplets 20 (i.e., P/2) (in other words, it is not essential that the pair of droplets 22 is disposed centrally between the mutually adjacent droplets 20), provided that the small droplets 24 are disposed at the positions in the region Q where the distance between the mutually adjacent droplets 20 is large, and where the small droplets 24 can prevent the droplets 22 of the second resin liquid from wetting and spreading further than necessary in the direction perpendicular to the direction of arrangement of the droplets 20. The amount of shift of the pair of the droplets 22 is desirably set to a range of (P/2)±20%, in other words, to a range of not less than 0.8×(P/2) and not more than 1.2×(P/2). For example, if the resolution is 1200 dpi, the amount of shift of the pair of the droplets 22 is desirably in the range of (21.2±2) μm.

Moreover, the diameter of the small droplets 24 after thermal curing is desirably equal to (the separation pitch P of the droplets 20)×(25% to 30%). In other words, desirably, the droplet diameter (after thermal curing) is in the range of not less than 0.25×P and not more than 0.30×P. For example, if the resolution is 1200 dpi, then desirably the droplet diameter (after thermal curing) is in the range of 5.3 μm to 6.4 μm.

The present embodiment has been described with reference to the mode where the small droplets 24 are contained completely within the region Q; however, the implementation of the invention is not limited to this mode, and it is also possible for the small droplets 24 to extend outside the region Q, provided that they do so only partially. In other words, although it is most desirable that the small droplets 24 are arranged so as to make contact with the boundary lines of the region Q in the direction perpendicular to the direction of arrangement of the mutually adjacent droplets 20 (in other words, with the common tangents 32A and 32B), as in the embodiment shown in FIG. 9, the small droplets 24 do not have to make contact with the boundary lines of the region Q in the direction perpendicular to the direction of arrangement of the mutually adjacent droplets 20 (in other words, with the common tangents 32A and 32B). More specifically, even if the small droplets 24 project outside the region Q, provided that it is only partially, then if this amount of projection is small, it is still possible to prevent the droplets 22 of the second resin liquid from wetting and spreading further than necessary. Desirably, the distance from the common tangent 32A (or 32B) between the mutually adjacent droplets 20 to the edge line of the small droplet 24 is within a range of 40% of the diameter of the small droplet 24 after thermal curing, and in particular, if the small droplet 24 projects out beyond the common tangent 32A (or 32B), then desirably, the distance from the common tangent 32A (or 32B) to the edge line of the small droplet 24 on the side where the small droplet 24 projects beyond the common tangent 32A (or 32B) is not more than 40% of the diameter of the small droplet 24 after thermal curing.

Figure 10:
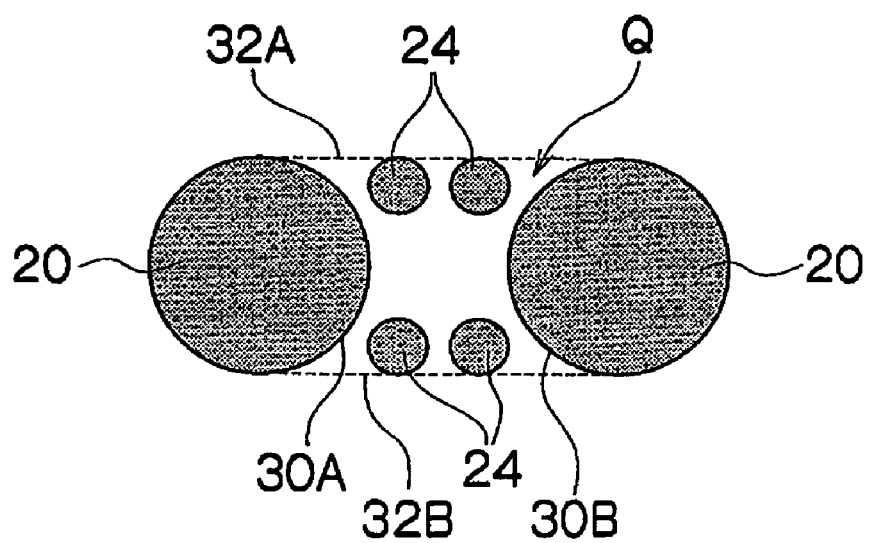
FIG. 10 is an illustrative diagram showing another embodiment of the arrangement of small droplets.

The present embodiment has been described with reference to the mode where the two small droplets 24 are arranged in the region Q corresponding to the gap between the mutually adjacent droplets 20; however, the implementation of the present invention is not limited to this mode, and it is also possible to arrange three or more small droplets 24 in the region Q. For example, as shown in FIG. 10, it is also possible to dispose four small droplets 24 between the mutually adjacent droplets 20. The number of small droplets 24 arranged inside the region Q is adjusted in accordance with the volume of the droplets 20, the separation pitch of the droplets 20, the volume of the small droplets 24, and the like.

Figure 11:
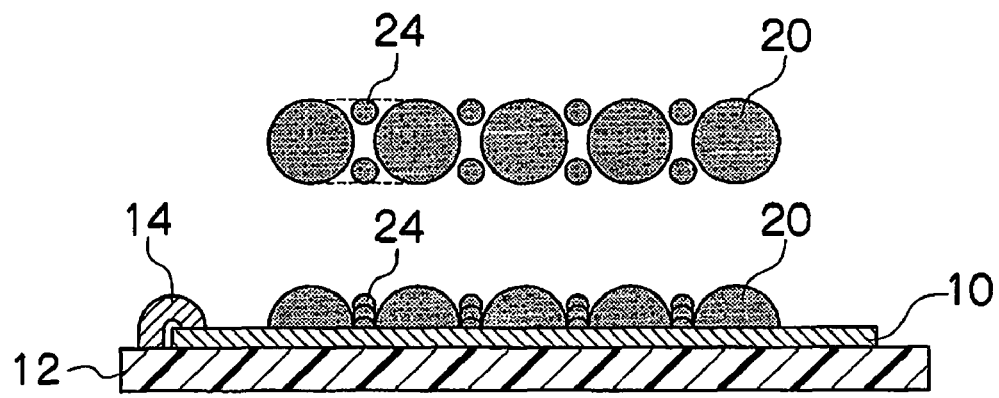
FIG. 11 is an illustrative diagram showing a mode where a plurality of small droplets are layered together.

Furthermore, in the present embodiment, a desirable mode is one where a plurality of small droplets 24 are layered at the same position on the substrate 10. More specifically, as shown in FIG. 11, by layering a plurality of small droplets 24 at the same position on the substrate 10, the height of the columns formed by the cured small droplets 24 in this layered state approaches the height of the droplets 20 disposed separately on either side thereof, and therefore the droplets 22 of the second resin liquid disposed in the subsequent step (the second resin liquid arrangement step) can be prevented more effectively from wetting and spreading in the direction perpendicular to the direction of arrangement of the droplets 20. Moreover, it is also possible to increase the droplet volume of the second resin liquid disposed between the mutually adjacent droplets 20, and the thickness of the resin film pattern can be made large.

After arranging and curing the at least two small droplets 24 between the mutually adjacent droplets 20 as described above, then similarly to the first embodiment, the droplets 22 of the second resin liquid are arranged between the mutually adjacent droplets 20 (the second resin liquid arrangement step), and when the droplets 22 have wet and spread so as to fill in the gaps between the mutually adjacent droplets 20, the droplets 22 of the second resin liquid are cured by irradiation of the ultraviolet light (the second resin liquid curing step).

According to the present embodiment, the cured small droplets 24, which are separately arranged so as not to make contact with the droplets 20 inside each of the regions Q corresponding to the gaps between the mutually adjacent droplets 20 on the substrate 10, in the respective edge portions of each of the regions Q in the direction perpendicular to the direction of arrangement of the droplets 20, function as the columns preventing the droplets 22 arranged between the mutually adjacent droplets 20 from wetting and spreading further than necessary in the direction perpendicular to the direction of arrangement of the droplets 20. Therefore, it is possible to form a desired resin film pattern.

In the present embodiment, the droplets 20, which are separately disposed on the substrate 10 in the first resin liquid arrangement step, and the small droplets 24, which are disposed in the regions Q corresponding to the gaps between the mutually adjacent droplets 20, are made of the same resin liquid (first resin liquid); however, the implementation of the present invention is not limited to this, and it is also possible to form the droplets 24 by means of a resin liquid different than the resin liquid for the droplets 20. In spite of this, a desirable mode is one where the droplets 20 and 24 are made of the same resin liquid, since this makes it possible to use the same curing device for the droplets 20 and 24, and therefore the composition of the apparatus is simplified and costs can be reduced.

Third Embodiment

Next, a resin film forming method according to a third embodiment of the present invention is described. Below, the portions that are common with the above-described embodiments are not explained further, and the following description centers on the characteristic features of the present embodiment.

In the resin film forming method according to the present embodiment, the volume of the droplets 22 of the second resin liquid, which are deposited in the second resin liquid arrangement step in the first embodiment or the second embodiment, is set to a volume corresponding to the spatial volume between the mutually adjacent droplets 20 of the first resin liquid, which have been separately arranged in the first resin liquid arrangement step. More specifically, the volume $S_2$ of the droplets 22 is adjusted to satisfy the following equation:

$$S_2 = (D \times T \times P) - (1/2) \times S_1,$$

where D is the diameter of the droplets 20 after thermal curing, T is the film thickness of the droplets 20 after thermal curing, P is the distance between the centers of the mutually adjacent droplets 20 (separation pitch), and $S_1$ is the volume of the droplets 20 after thermal curing.

Thus, it is possible to optimize the volume $S_2$ of the droplets 22 of the second resin liquid by setting the volume 82 to the volume that corresponds to the spatial volume between the mutually adjacent droplets 20, and therefore a resin film pattern of uniform width and uniform film thickness can be obtained.

Fourth Embodiment

Next, a resin film forming apparatus according to a fourth embodiment of the present invention is described.

Figure 12:
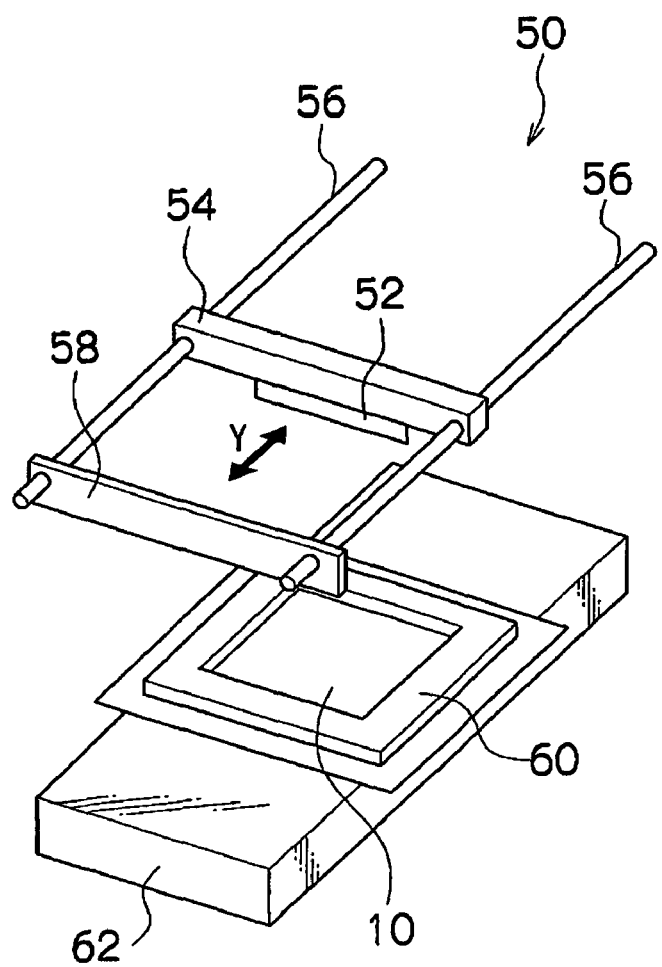
FIG. 12 is a perspective diagram showing a general view of the overall composition of a resin film forming apparatus according to a fourth embodiment.

FIG. 12 is a perspective diagram showing a general view of the overall composition of the resin film forming apparatus 50 according to the fourth embodiment. The resin film forming apparatus 50 shown in FIG. 12 includes: a liquid ejection head 52, which ejects and deposits droplets of the first and second resin liquids onto a substrate 10 by using the inkjet method; a Y axis arm 54, which supports the liquid ejection head 52; two Y axis guides 56, which support either end portion of the Y axis arm 54; a UV light source 58, the end portions of which are supported by the two Y axis guides 56 at a uniform interval from the liquid ejection head 52; an upper fixing table 60, which supports the substrate 10 on the obverse side (the surface onto which the droplets of the resin liquids ejected from the liquid ejection head 52 are deposited); and a lower fixing table 62, which supports the substrate 10 on the reverse side. The upper fixed table 60 also serves as the heating device and the heat conduction device described in the first embodiment.

Furthermore, although omitted from the drawings, the resin forming apparatus 50 has a Y axis mechanism, which moves each of the liquid ejection head 52 and the UV light source 58 to scan the substrate 10 in the direction of movement (sub-scanning direction) indicated with the arrow Y in FIG. 12.

The liquid ejection head 52 shown in FIG. 12 is a line type of head having a nozzle row in which nozzles (not shown) for ejecting the resin liquids are arranged through a length corresponding to the width of the substrate 10 (the length in the main scanning direction, which is perpendicular to the direction of movement of the liquid ejection head 52 (sub-scanning direction) indicated with the arrow Y shown in FIG. 12), and it is able to form the resin film pattern over the whole area of the substrate 10 by scanning the substrate 10 with the liquid ejection head 52 just once in the sub-scanning direction (in other words, by means of one sub-scanning action).

The liquid ejection head 52 shown in FIG. 12 may be constituted by arranging together, in the breadthways direction of the substrate 10, a plurality of liquid ejection heads, each of which is shorter in length than the width of the substrate 10.

The present embodiment has been described with reference to the embodiment of the mode where the droplets of the first and second resin liquids are ejected from the same liquid ejection head 52; however, the implementation of the present invention is not limited to this, and there is also a mode where, for example, droplets of resin liquids are ejected respectively from corresponding liquid ejection heads provided independently for the resin liquids, as described in the fifth embodiment described below (see FIG. 13).

Moreover, although not shown in the drawings, there is also a mode where the resin film forming apparatus 50 has a Z axis mechanism, which alters the distance between the surface of the substrate 10 (the surface where the resin film pattern is formed) and the ejection surface (nozzle surface) of the liquid ejection head 52. When the droplets of the resin liquids are ejected from the liquid ejection head 52 toward the substrate 10, the liquid ejection head 52 is moved in the Z axis direction by means of the Z axis mechanism, thereby adjusting the distance from the ejection surface of the liquid ejection head 52 to the surface of the substrate 10 to a prescribed value (for example, 1 millimeter to several millimeters).

The UV light source 58 is constituted of a line-shaped ultraviolet LED (light-emitting diode), or the like, which extends through a length corresponding to the width of the substrate 10, and similarly to the liquid ejection head 52, it is able to irradiate ultraviolet light over the whole area of the substrate 10 by scanning the substrate 10 with the UV light source 58 just once in the sub-scanning direction.

The upper fixed table 60 also serves as the heating device and the heat conduction device, and the upper fixed table 60 carries out heating in such a manner that the surface of the substrate 10 assumes the prescribed temperature.

The resin film forming apparatus 50 also has a control device (not shown), which controls ejection of the liquid ejection head 52, controls light emission by the UV light source 58, and controls heating of the upper fixed table (heating device) 60, and this control device implements any one of the resin film forming methods described in the respective embodiments (first to fourth embodiments), in order to form a desired resin film pattern on the substrate 10.

Fifth Embodiment

Next, a resin film forming apparatus according to a fifth embodiment of the present invention is described.

Figure 13:
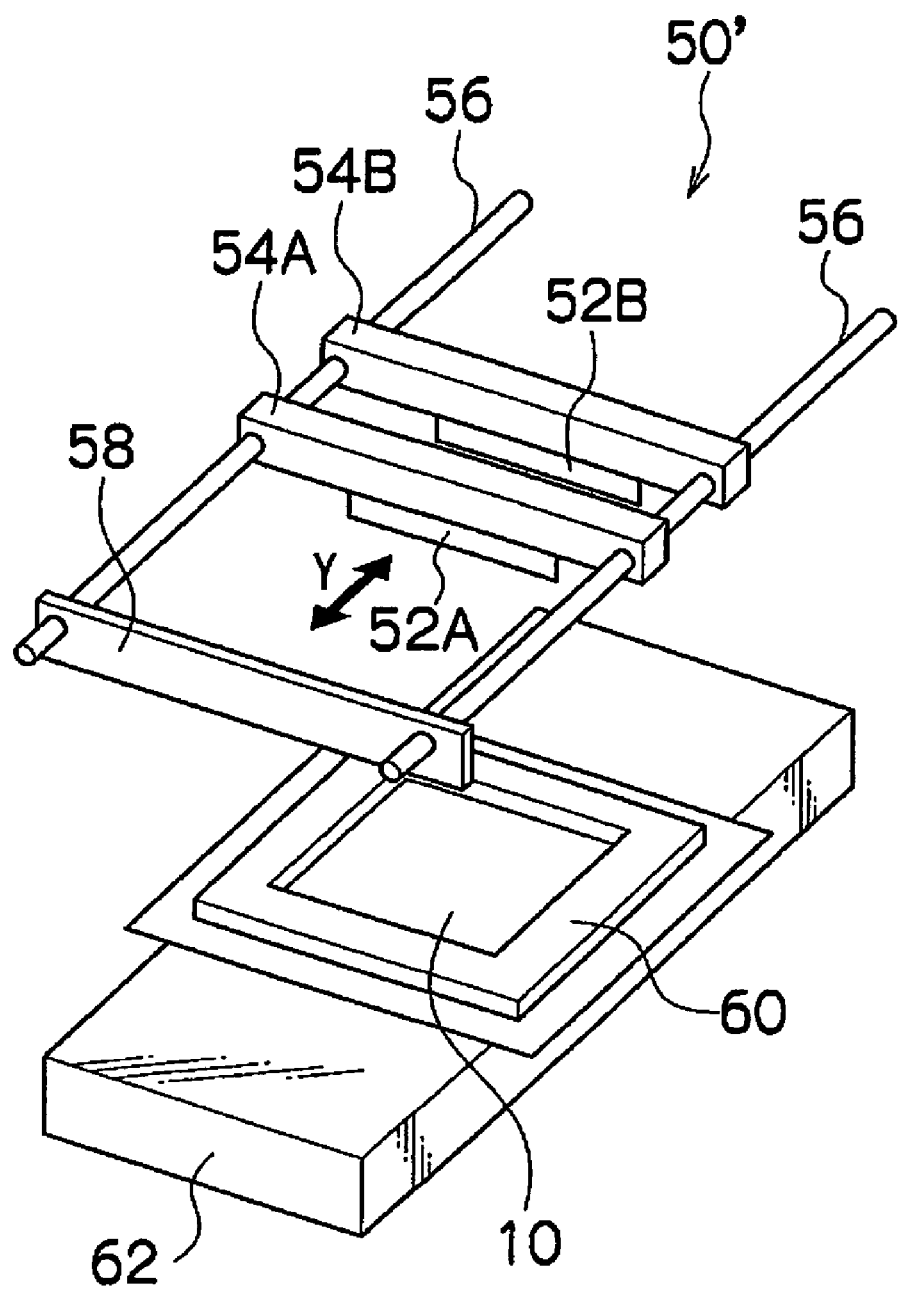
FIG. 13 is a perspective diagram showing a general view of the overall composition of a resin film forming apparatus according to a fifth embodiment.

FIG. 13 is a perspective diagram showing a general view of the overall composition of the resin film forming apparatus 50' according to the fifth embodiment. In FIG. 13, the portions that are common with those shown in FIG. 12 are denoted with the same reference numbers, and further description thereof is omitted here.

In the present embodiment, liquid ejection heads are provided correspondingly to the resin liquids, respectively. More specifically, as shown in FIG. 13, the resin film forming apparatus 50' according to the present embodiment has a liquid ejection head 52A that corresponds to a first resin liquid which is thermally curable, and a liquid ejection head 52B that corresponds to a second resin liquid which is ultraviolet curable. The corresponding resin liquids are ejected in the form of droplets from the liquid ejection heads 52A and 52B, respectively. In the embodiment shown in FIG. 13, the liquid ejection heads 52A and 52B are supported on different Y axis arms 54A and 54B; however, it is also possible for the liquid ejection heads 52A and 52B to be supported on the same Y axis arm.

According to the mode where the liquid ejection heads are provided for the respective resin liquids, it is possible to deposit the droplets of the second resin liquid immediately after depositing the droplets of the first resin liquid on the substrate 10, and therefore productivity is improved. In particular, since the first resin liquid arrangement step and the second resin liquid arrangement step can be carried out in parallel at different positions on the substrate 10, then productivity is improved.

Figure 14:
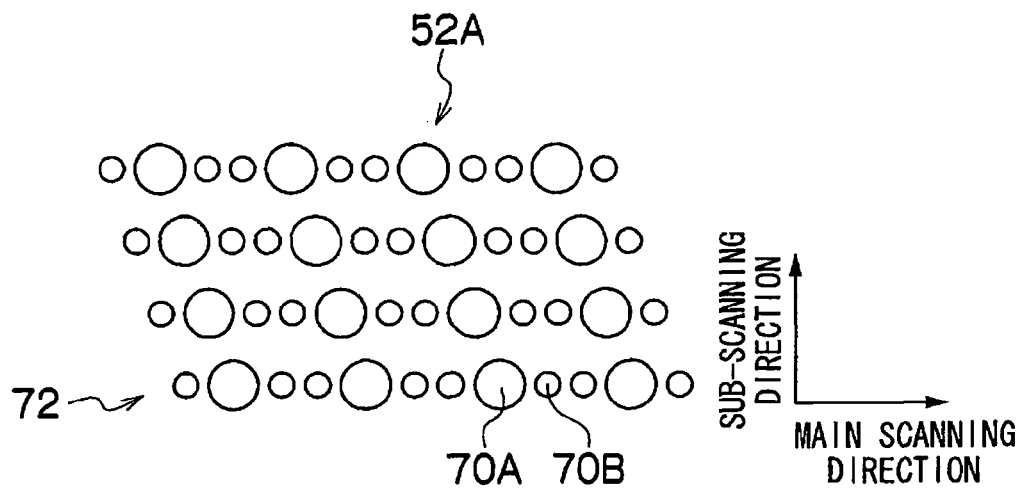
FIG. 14 is a plan diagram showing an embodiment of a nozzle arrangement.

FIG. 14 is a plan diagram showing an embodiment of the nozzle arrangement in the liquid ejection head 52A corresponding to the first resin liquid. In the embodiment shown in FIG. 14, a plurality of nozzle rows 72 are arranged following an oblique direction, which is not perpendicular to the main scanning direction, in which the nozzle rows 72 each including large and small nozzles 70A and 70B to eject droplets of different volumes are arranged systematically following the main scanning direction. In the nozzle rows 72, the large nozzles 70A, which have a large droplet volume, are arranged equidistantly in the main scanning direction, and two small nozzles 70B, which have a small droplet volume, are arranged between each pair of large nozzles 70A that are mutually adjacent in the main scanning direction. In other words, the small nozzle 70B is disposed on both sides of each large nozzle 70A in the main scanning direction.

By adopting the mode in which the large and small nozzles 70A and 70B are arranged in the liquid ejection head 52A, which corresponds to the first resin liquid, the droplets of the main size are ejected from the large nozzles 70A in the initial droplet arrangement step, and the droplets of the small size can be ejected from the small nozzles 70B, which are situated on both sides of each large nozzle 70A, in the subsequent droplet arrangement step. For example, the droplets of the main size and the droplets of the small size can be simultaneously ejected respectively from the large and small nozzles 70A and 70B, and arranged on the substrate 10 and hence productivity is improved. This is particularly suitable in respect of the resin film forming method according to the second embodiment.

Figure 15:
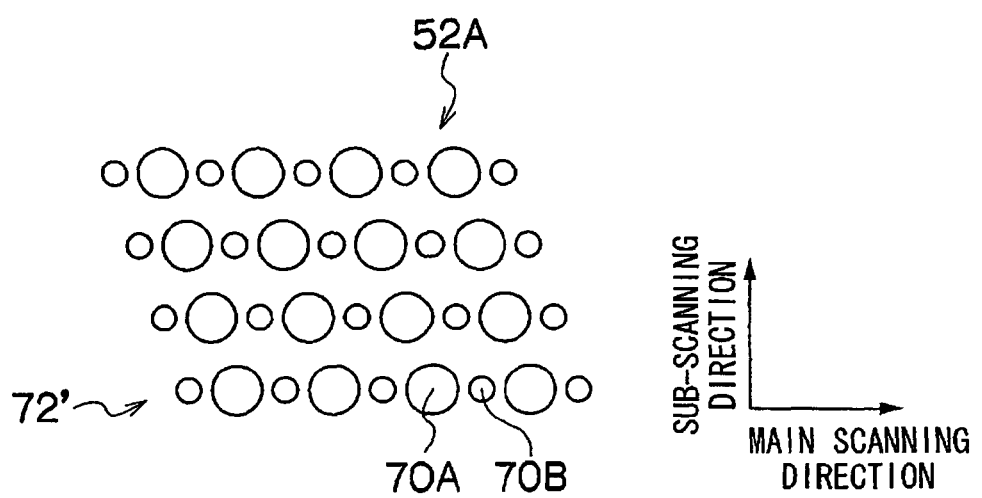
FIG. 15 is a plan diagram showing another embodiment of a nozzle arrangement.

FIG. 15 is a plan diagram showing another embodiment of the nozzle arrangement in the liquid ejection head 52A corresponding to the first resin liquid. In FIG. 15, the parts that are common with those shown in FIG. 14 are denoted with the same reference numerals, and further description thereof is omitted here. In the embodiment shown in FIG. 15, the large nozzles 70A and the small nozzles 70B are arranged alternately in the nozzle rows 72' in the main scanning direction. In other words, in FIG. 14, the number of the small nozzles 70B arranged between the large nozzles 70A that are mutually adjacent in the main scanning direction is two, whereas in FIG. 15, one shared small nozzle 70B is arranged between the mutually adjacent large nozzles 70A.

According to the nozzle arrangement shown in FIG. 15, the overall number of the small nozzles 70B arranged in the liquid ejection head 52A is lower than in the case shown in FIG. 14, and therefore it is possible to simplify the composition of the liquid ejection head 52A.

Sixth Embodiment

Next, a method of manufacturing a printed circuit board (electronic circuit board) according to a sixth embodiment of the present invention is described.

Figure 16A:
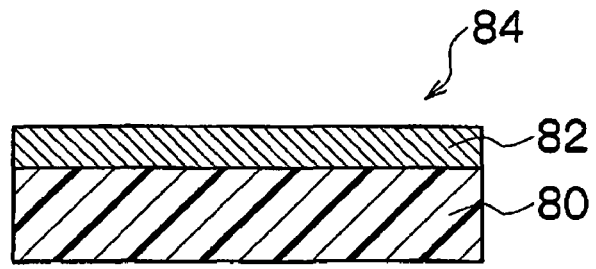
FIGS. 16A to 16D are step diagrams showing a printed circuit board manufacturing method according to a sixth embodiment.

FIGS. 16A to 16D are step diagrams showing the printed circuit board manufacturing method according to the sixth embodiment. In the printed circuit board manufacturing method according to the present embodiment, as shown in FIG. 16A, a substrate 84 is previously prepared by forming a conductor layer 82 on the surface of an insulating substrate 80. When forming a resist pattern on the surface of the substrate 84 (the surface where the conductor layer 82 is formed), it is suitable to use any one of the resin film forming methods according to the first to fourth embodiments described above.

Figure 16B:
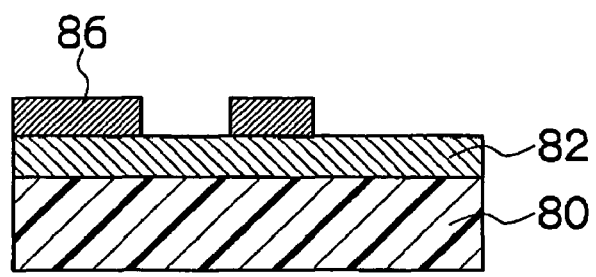
Figure 16C:
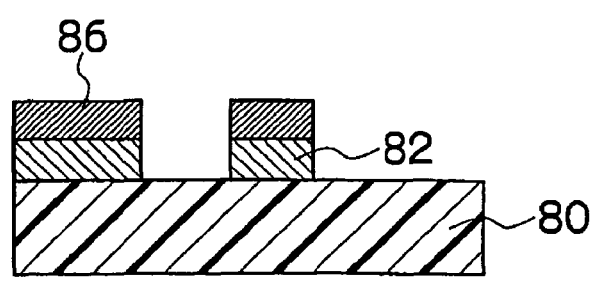
Figure 16D:
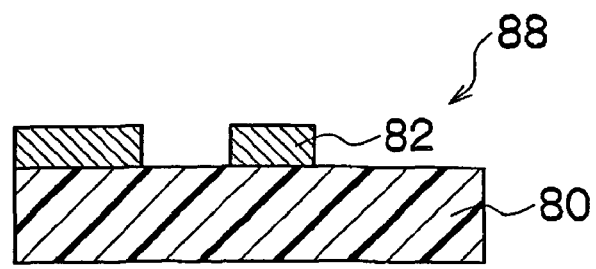
Figure 17A:
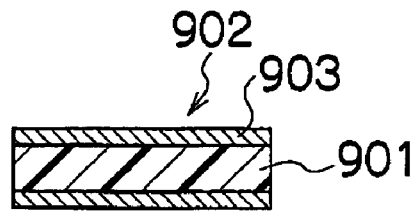
FIGS. 17A to 17F are illustrative diagrams of a subtractive method in the related art.
Figure 17B:
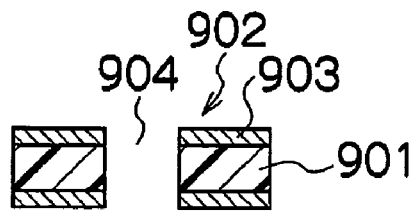
Figure 17C:
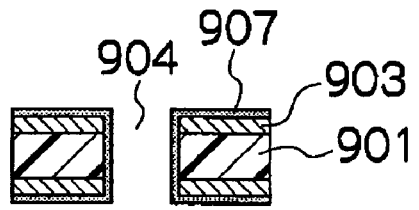
Figure 17D:
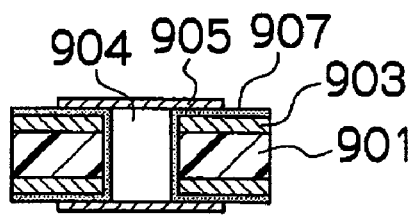
Figure 17E:
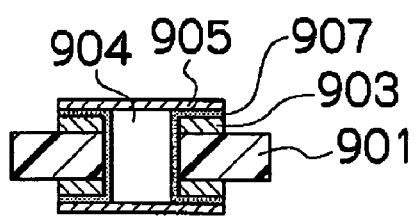
Figure 17F:
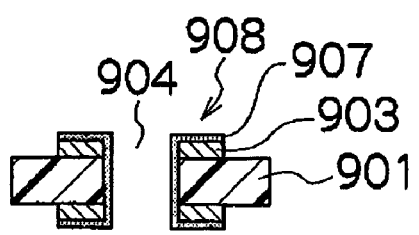
Figure 18A:
FIGS. 18A to 18E are illustrative diagrams of an additive method in the related art.
Figure 18B:
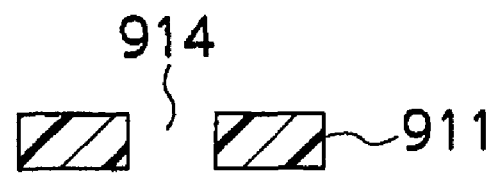
Figure 18C:
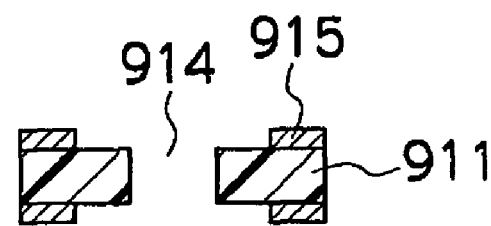
Figure 18D:
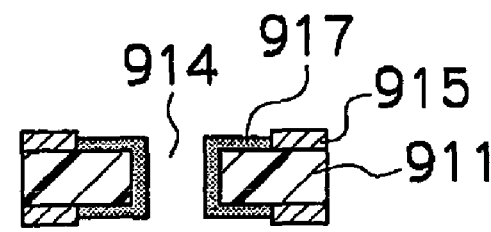
Figure 18E:
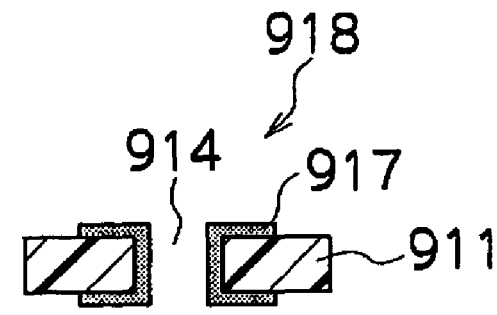
Figure 19A:
FIGS. 19A to 19G are illustrative diagrams of a semi-additive method in the related art.
Figure 19B:
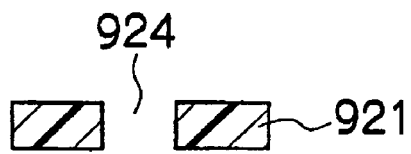
Figure 19C:
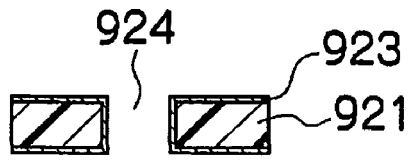
Figure 19D:
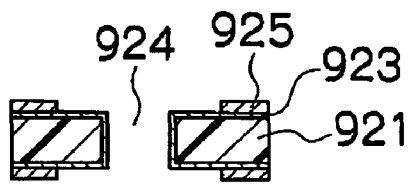
Figure 19E:
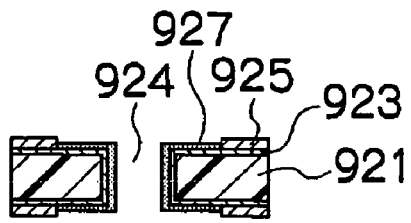
Figure 19F:
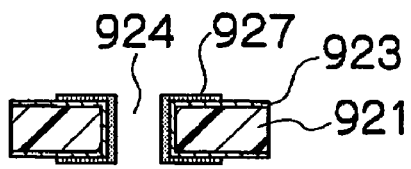
Figure 19G:
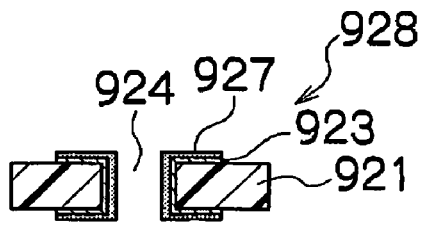

As shown in FIG. 16B, a resist pattern 86 is formed on the surface of the substrate 84. Thereupon, the portions of the conductor layer 82 not covered with the resist pattern 86 are removed, thereby patterning the conductor layer 82 as shown in FIG. 16C. Then, the resist pattern 86 is removed, thereby yielding a printed circuit board 88 on which a desired wiring pattern (circuit pattern) has been formed, as shown in FIG. 16D.

The resin film forming method, the resin film forming apparatus and the electronic circuit board manufacturing method according to the present invention have been described in detail above; however, the present invention is not limited to the aforementioned embodiments, and it is of course possible for improvements or modifications of various kinds to be implemented, within the spirit and scope of the invention as expressed in the appended claims.

What is claimed is:

1. A method of forming a resin film on a substrate by depositing droplets of resin liquid by an inkjet method, comprising:
    a first resin liquid arrangement step of arranging a plurality of droplets of a first resin liquid separately from each other on a substrate in such a manner that the droplets do not make contact with each other;
    a first resin liquid curing step of curing at least a surface of each of the droplets of the first resin liquid arranged on the substrate;
    a second resin liquid arrangement step of arranging a plurality of droplets of a second resin liquid at substantially central positions between the droplets of the first resin liquid on the substrate, after the at least the surface of each of the droplets of the first resin liquid is cured;
    a second resin liquid curing step of curing the droplets of the second resin liquid arranged on the substrate,
    a third resin liquid arrangement step of separately arranging at least two droplets of a third resin liquid of smaller volume than the droplets of the first resin liquid so as not to make contact with the droplets of the first resin liquid at respective edge portions, in a direction perpendicular to a direction of arrangement of the droplets of the first resin liquid, of a region corresponding to a gap between the droplets of the first resin liquid on the substrate; and
    a third resin liquid curing step of curing at least a surface of each of the droplets of the third resin liquid arranged on the substrate,
    wherein the second resin liquid arrangement step is carried out after the at least the surface of each of the droplets of the third resin liquid is cured.

2. The method as defined in claim 1, wherein the first resin liquid and the third resin liquid have identical curing properties.

3. The method as defined in claim 1, wherein in the third resin liquid arrangement step, the droplets of the third resin liquid are layered together at an identical position on the substrate.

* * * * *